(12) United States Patent
Terashima

(10) Patent No.: US 6,399,893 B1
(45) Date of Patent: Jun. 4, 2002

(54) ELECTRONIC DEVICE

(75) Inventor: Kiminori Terashima, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/301,503

(22) Filed: Apr. 28, 1999

(30) Foreign Application Priority Data

May 11, 1998  (JP) ............................................. 10-127052

(51) Int. Cl.⁷ .................................................. H05K 1/16
(52) U.S. Cl. ........................ 174/260; 174/255; 361/760; 439/74
(58) Field of Search ................................. 174/260, 255; 361/760, 767, 783, 807, 764; 439/74

(56) References Cited

U.S. PATENT DOCUMENTS

| | | | | |
|---|---|---|---|---|
| 3,885,173 A | * | 5/1975 | Lee ............................. | 361/767 |
| 4,861,941 A | | 8/1989 | Kubo et al. | |
| 5,805,423 A | * | 9/1998 | Wever et al. ................ | 361/807 |
| 5,978,229 A | * | 11/1999 | Kim ............................ | 361/760 |

FOREIGN PATENT DOCUMENTS

| | | |
|---|---|---|
| DE | 81 23 367.1 | 11/1981 |
| DE | 3922461 A1 | 1/1990 |
| DE | 295 05 327 U1 | 9/1995 |
| EP | 0 265 285 A2 | 4/1988 |
| JP | Hei 5-206674 | 8/1993 |
| JP | Hei 8-181459 | 7/1996 |
| WO | WO 94/06268 | 3/1994 |

* cited by examiner

*Primary Examiner*—Albert W. Paladini
(74) *Attorney, Agent, or Firm*—Brinks Hofer Gilson & Lione

(57) ABSTRACT

In the electronic device of the present invention, leg portions of a frame are projected downward from the underside of a printed circuit board, so the positioning of the electronic device can be done by inserting the leg portions into holes formed in a mother printed circuit board. Thus, when the electronic device is surface-mounted to the mother board, there is no fear of its dislocation even under vibration or shock. Accordingly, the electronic device is not deteriorated at all in its quality.

19 Claims, 4 Drawing Sheets

ELECTRONIC DEVICE

BACKGROUND OF THE INVENTION

1. Field of the Invention

The present invention relates to an electronic device suitable for use in, for example, transmitter-receiver unit of a portable telephone.

2. Description of the Prior Art

A conventional electronic device will now be described with reference to FIGS. 6 to 8. A box-shaped frame 21 formed by a metallic plate is provided with side walls 21a which define an inside space having upper and lower openings and is also provided with mounting legs 21b formed in the side walls 21a.

On a printed circuit board 22 is formed a conductive pattern 23, to which various electric parts (not shown) are soldered to constitute a desired circuit.

The printed circuit board 22 is inserted from below the frame 21 into the inside space defined by the frame 21 and is secured to the frame by bending the mounting legs 21b inwards.

The mounting legs 21b and the conductive pattern 23 are soldered together at 24 to earth the conductive pattern 23 to the frame 21.

As shown in FIG. 8, the electronic device such as a transmitter-receiver unit constructed as above is then mounted onto such as a mother printed circuit board 25 of the portable telephone and is used.

In this case, the electronic device is surface-mounted onto the mother printed circuit board 25. More particularly, first the electronic device is put on a predetermined place of the mother printed circuit board 25 and thereafter a cream solder is applied to each corner portion between a conductive pattern 26 on the mother board 25 and the frame 21 of the electronic device.

Then, the mother board 25 and the electronic device are put on a belt (not shown) and are conveyed to a reflow treatment device to ensure soldering between the conductive pattern 26 on the mother board 25 and the frame 21.

In the conventional electronic device, the frame 21 is mounted merely by being put on the mother board 25, so at the time of surface mounting there is a fear that soldering may be done in a dislocated state of the electronic device from a predetermined position on the mother board due to vibration or shock. Therefore, the quality of the device may deteriorate.

Further, since soldering is performed at corner portions between the frame 21 and the mother board 25, there arises the problem that at the time of surface mounting the solder spreads along the corner portions and hence becomes thinner, thus resulting in the soldering being not effected to a satisfactory extent.

SUMMARY OF THE INVENTION

According to the first means adopted by the present invention for solving the above-mentioned problems there is provided an electronic device comprising a metallic frame having side walls and leg portions projecting downward from the side walls and a printed circuit board having through portions, the through portions being each constituted of a through hole or cutout portion, and wherein the printed circuit board is put on the underside of the frame in a partially outwardly projected state of the printed circuit board from the side walls, and the leg portions of the frame are inserted into the through portions of the printed circuit board and are projected downward from the underside of the same board.

According to the second means for solution adopted by the invention, the leg portions are tightly fitted in the through portions.

According to the third means for solution adopted by the invention, the leg portions each have a tapered portion which is wider gradually from its base end portion toward its tip end portion.

According to the fourth means for solution adopted by the invention, the printed circuit board has gap portions contiguous to the through portions.

According to the fifth means for solution adopted by the invention, the gap portions are each adjacent to a side end portion of the printed circuit board and partially opened in the side end portion.

According to the sixth means for solution adopted by the invention, the printed circuit board has a conductive pattern in proximity to the leg portions.

DETAILED DESCRIPTION OF PREFERRED EMBODIMENTS

Figure 1:
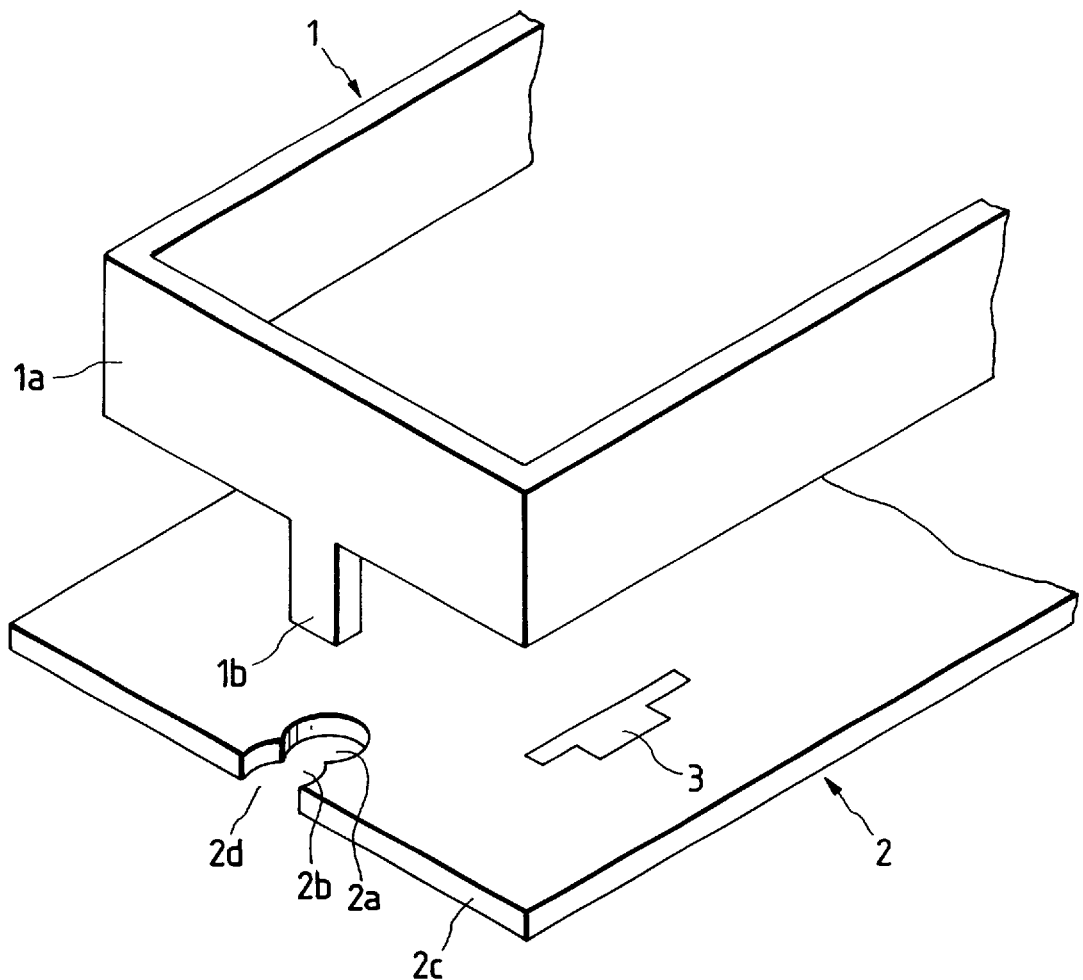
FIG. 1 is a partial exploded perspective view of an electronic device according to an embodiment of the present invention.
Figure 2:
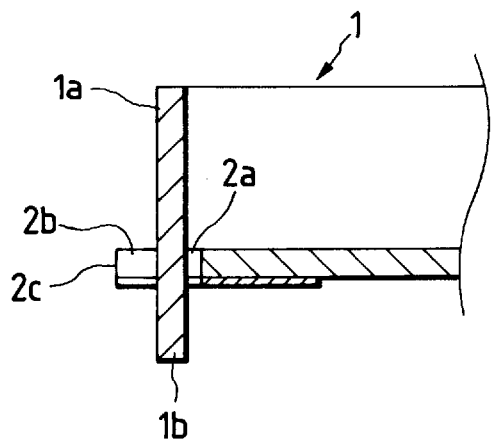
FIG. 2 is a sectional view of a principal portion of the electronic device.
Figure 3:
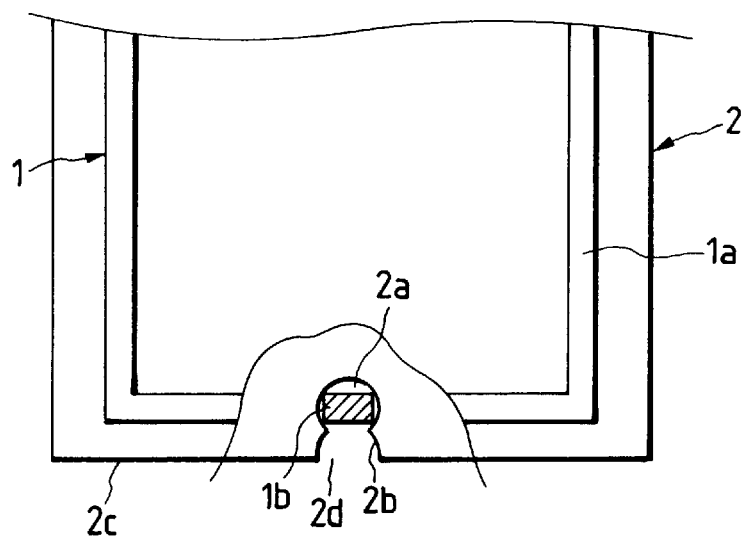
FIG. 3 is a partially cut-away plan view of the electronic device.
Figure 4:
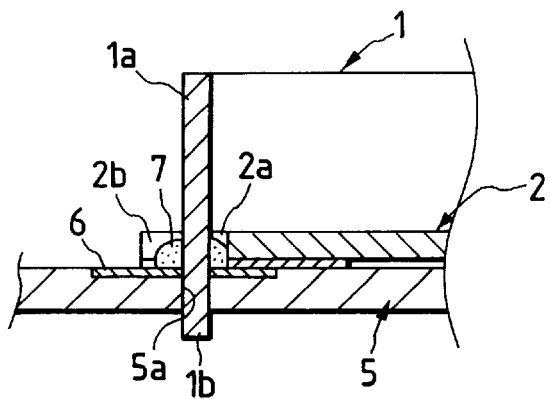
FIG. 4 is a sectional view of a principal portion showing a mounted state of the electronic device.
Figure 5:
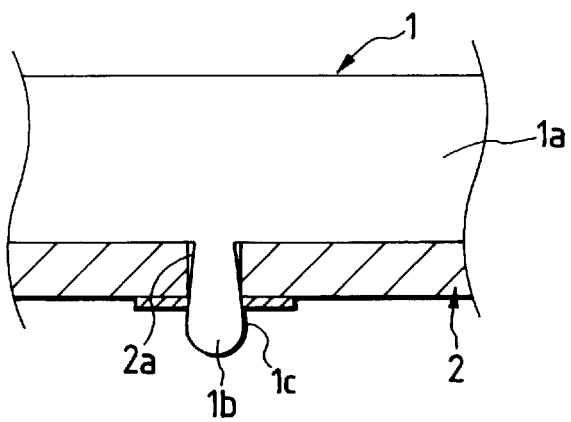
FIG. 5 is a sectional view of an electronic device according to another embodiment of the present invention.
Figure 6:
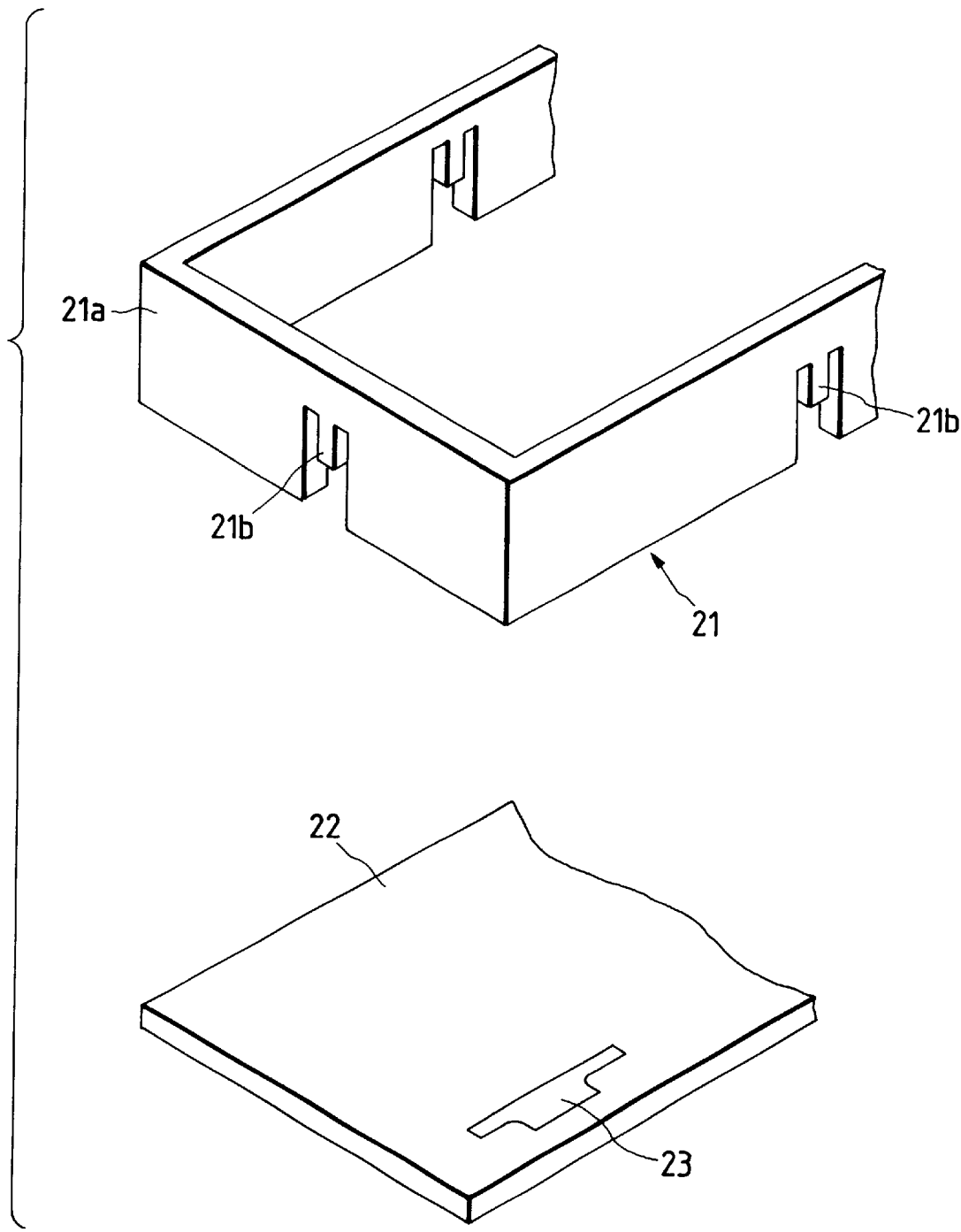
FIG. 6 is a partial perspective view of a conventional electronic device.
Figure 7:
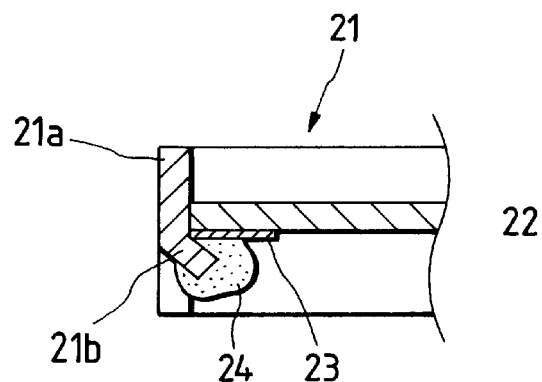
FIG. 7 is a sectional view of a principal portion of the conventional electronic device.
Figure 8:
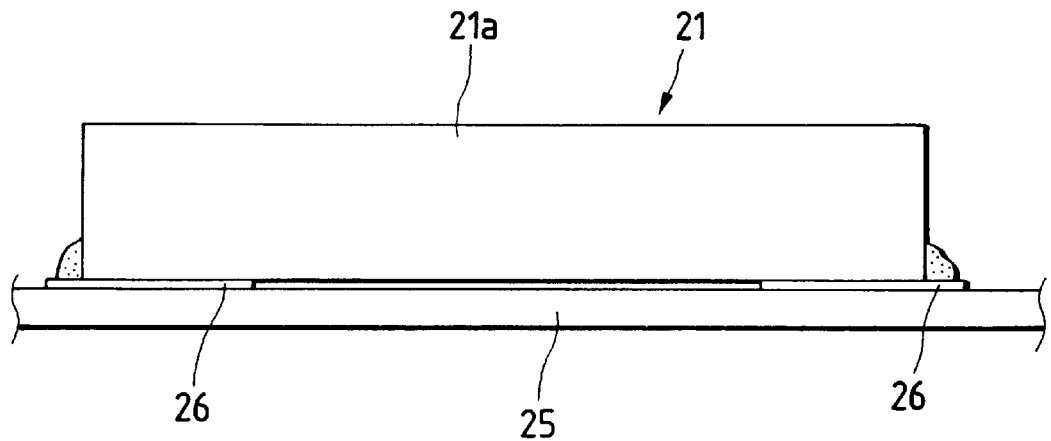
FIG. 8 is a sectional view of a principal portion showing a mounted state of the conventional electronic device.

Electronic devices embodying the present invention will be described hereinunder with reference to FIGS. 1 to 5. FIG. 1 is a partial exploded perspective view of an electronic device according to an embodiment of the present invention, FIG. 2 is a sectional view of a principal portion of the electronic device, FIG. 3 is a partially cut-away plan view of the electronic device, FIG. 4 is a sectional view of a principal portion showing an installed state of the electronic device, and FIG. 5 is a sectional view of an electronic device according to another embodiment of the present invention.

The construction of an electronic device according to an embodiment of the present invention will now be described with reference to FIGS. 1 to 4. A box-shaped frame 1 formed by a metallic plate is provided with side walls 1a which define an inside space having upper and lower openings and is also provided with a plurality of leg portions 1b projecting downward from the lower ends of the side walls 1a.

A printed circuit board 2 has through portions 2a each constituted of an arcuate through recess, gap portions 2b contiguous to the through portions 2a respectively and each constituted of an arcuate through recess, and open portions 2d each formed by opening part of the associated gap portion 2b in a side end portion 2c.

The through portions 2a and the gap portions 2b may each be formed by a hole formed through the printed circuit board 2.

A conductive pattern 3 is formed on the printed circuit board 2 and various electric parts (not shown) are soldered to the conductive pattern 3 to constitute a desired circuit.

As shown in FIGS. 2 and 3, the printed circuit board 2 is put on the underside of the frame 1 in a partially outwardly projected state from the side walls 1a.

In this case, the leg portions lb of the frame 1 are projected downward from the underside of the printed circuit board 2 while being tightly fitted respectively in the through portions 2a of the printed circuit board 2.

By such tight fitting of the frame leg portions 1b in the through portions 2a of the printed circuit board 2 the same board is secured to the frame 1. If necessary, the leg portions 1b and the conductive pattern 3 may be soldered together to ensure a firm installation of the printed circuit board and earthing of the conductive pattern 3 to the frame 1.

The electronic device such as a transmitter-receiver unit thus constructed is mounted onto, for example, a mother printed circuit board 5 of a portable telephone and is used, as shown in FIG. 4.

In this case, the electronic device is surface-mounted onto the mother board 5. More specifically, first, the electronic device is put on the mother board 5 while inserting the leg portion 1b projecting from the underside of the printed circuit board 2 into holes 5a formed in the mother board to effect positioning of the electronic device with respect to the mother board.

A cream solder is applied into the gap portions 2b of the printed circuit board 2, allowing the cream solder to be present between a conductive pattern 6 on the mother board 5 and each frame leg portion 1b of the electronic device.

Next, the mother board 5 and the electronic device are put on a belt (not shown) and are conveyed to a reflow treatment device, in which the conductive pattern on the mother board and the frame 1 are soldered together at 7.

Referring to FIG. 5, there is illustrated an electronic device according to another embodiment of the present invention. In this embodiment, leg portions 1b of a frame 1 are each formed with a tapered portion 1c which is wider gradually from its base end portion toward its tip end portion.

The tapered portions 1c function to prevent the printed circuit board 2 from coming off the frame 1 when the printed circuit board is brought into engagement with the leg portions 1b of the frame.

Other constructional points are the same as in the previous embodiment, so common components are identified by the same reference numerals and explanations thereof will be omitted.

According to the electronic device of the present invention, as set forth above, the leg portions 1b of the frame 1 are projected from the underside of the printed circuit board 2. By inserting the leg portions lb into the holes 5a of the mother printed circuit board 5, it is possible to effect positioning of the electronic device and prevent the electronic device from being dislocated even under vibration or shock at the time of surface-mounting of the electronic device. Consequently, the electronic device is free of any defect in its quality.

Besides, the frame 1 and the printed circuit board 2 can be combined together by tightly fitting the leg portions 1b into the through portions 2a of the printed circuit board 2. It is not necessary to perform such an operation as caulking. Thus, it is possible to provide an electronic device superior in productivity.

Moreover, where the leg portions 1b are each formed with the tapered portion 1c which is wider gradually from its base end portion toward its tip end portion, it is possible to surely prevent the printed circuit board 2 from coming off the leg portions 1b, and the printed circuit board 2 can be surely brought into abutment against the underside of the side walls 1a of the frame 1. Thus, it is possible to provide an electronic device of a high accuracy.

Further, by forming the gap portions 2b contiguous to the through portions 2a in the printed circuit board 2, it is possible to let the gap portions 2b serve as solder sumps. Thus, it is possible to provide an electronic device capable of being soldered firmly onto the mother board 5.

Further, by forming the open portion 2d in each gap portion 2b it is possible to enlarge the gap portion 2b, so that the application of a cream solder becomes easier and it is possible to effect soldering over a wider area. Thus, it is possible to provide an electronic device which can be soldered reliably.

Further, by forming the conductive pattern 3 in proximity to the leg portions 1b on the printed circuit board 2, it is possible to effect soldering of the printed circuit board with the conductive pattern simultaneously with soldering of the conductive pattern 6 on the mother board 5 with the leg portions 1b. Therefore, it is possible to save the trouble of soldering the conductive pattern 3 to the frame 1 and hence possible to provide an electronic device superior in productivity.

What is claimed is:

1. An electronic device comprising:

a metallic frame having leg portion s projecting downward from lower surfaces of side walls; and a printed circuit board having a hole through which said leg portion of said frame is inserted;

wherein said printed circuit board is of such a size as protruded out of a periphery of said frame, when said frame is placed on the printed circuit board, wherein the protruded portion of said printed circuit board has a gap portion having a hole to said through portions, wherein said printed circuit board is placed on the underside of said frame in a state in which the part having said gap portion of said printed circuit board is protruded out of a circumference of the fame, and wherein said leg portions of said frame are inserted into said through portions of said printed circuit board and projected downward from the underside of said printed circuit board by a predetermined length.

2. An electronic device according to claim 1, wherein said leg portions are tightly fitted in said through portions.

3. An electronic device according to claim 2, wherein said leg portions each have a tapered portion which is wider gradually from its base end portion toward its tip end portion.

4. An electronic device according to claim 1, wherein said printed circuit board has a conductive pattern proximity to said leg portions.

5. An electrical device, comprising:

an electrically conductive frame having at least one electrically conductive leg that extends from said frame; and a printed circuit board having a first hole that coextends with a second hole, said first hole configured to receive and friction fit with said leg; and wherein, said second hole defines a solder reservoir.

6. The electrical device according to claim 5, wherein said printed circuit board includes an electrically conductive pattern, and a bond between said leg and said conductive pattern on printed circuit board comprises hardened solder.

7. The electrical device according to claim 6, comprising a mother board disposed below and in contact with said printed circuit board; said mother board comprising a hole configured to receive said leg and in communication with an electrically conductive pattern.

8. The electrical device according to claim 5 wherein said second hole contains solder.

9. The electrical device according to claim 8, comprising a mother board disposed below and in contact with said printed circuit board, said mother board having a hole configured to receive said leg and forming a base of said solder reservoir on said printed circuit board.

10. The electrical device according to claim 5, wherein said leg comprises a tapering leg.

11. A method for attaching and conductively connecting an electrical component to a printed circuit board, comprising the steps of:

providing a first electrical component having an extending leg;

providing a second electrical component having first hole that fits said leg and having a second hole adjacent to and coextending with said first hole;

combining said electrical components together with said leg friction fitting in said first hole on said printed circuit board; and applying solder to create an electrically conductive bond between said first and said second electrical components thereby permitting solder to flow from said first hole to said second hole to define a solder reservoir.

12. The method of claim 11, further comprising the step of conductively bonding said leg and said conductive pattern together with solder.

13. The method of claim 11, further comprising the steps of providing at least one electrically conductive leg in electrical communication with said first electrical component and providing a conductive pattern for said second electrical component in communication with one of said two holes, so that the solder provides an electrically conductive bond between said leg and said conductive pattern.

14. The method of claim 11, wherein the step of providing said first electrical component comprises providing an electrically conductive metal frame.

15. The method of claim 14, comprising the step of positioning and second hole in a 'U' shape.

16. The method of claim 11, wherein the step of providing said first electrical component comprises providing at least one electrically conductive leg.

17. The method of claim 11, wherein the step of providing said first electrical component comprises providing an electrically conductive metal frame with an electrically conductive leg.

18. The method of claim 11, further comprising:

aligning a hole on a third electrical component with said first hole on said second component, for receiving said leg; and assembling said first, said second and said third electrical components by pressing said components together.

19. The method of claim 18, further including the steps of:

providing said first electrical component with at least one electrically conductive leg; and providing said second electrical component with a conductive pattern in communication with at least one hole on said second component for conductively bonding said leg and said second conductive pattern;

providing said third electrical component with a conductive pattern in communication with the hole on said third component, for conductively bonding said leg and said conductive pattern; and conductively bonding the leg and the conductive patterns on the second and third electrical components.

\* \* \* \* \*

UNITED STATES PATENT AND TRADEMARK OFFICE
CERTIFICATE OF CORRECTION

PATENT NO. : 6,399,893 B1
DATED : June 4, 2002
INVENTOR(S) : Kiminori Terashima

It is certified that error appears in the above-identified patent and that said Letters Patent is hereby corrected as shown below:

Column 4,
Line 58, insert -- in -- before "proximity".

Column 6,
Line 10, delete "and" and substitute -- a -- in its place.

Signed and Sealed this

Twenty-fifth Day of February, 2003

JAMES E. ROGAN
*Director of the United States Patent and Trademark Office*